United States Patent
Kim et al.

(10) Patent No.: US 7,821,803 B2
(45) Date of Patent: Oct. 26, 2010

(54) MEMORY MODULE HAVING STAR-TYPE TOPOLOGY AND METHOD OF FABRICATING THE SAME

(75) Inventors: Do-Hyung Kim, Gyeonggi-do (KR); Byoung-Ha Oh, Gyeonggi-do (KR); Young-Jun Park, Gyeonggi-do (KR); Yong-Ho Ko, Gyeonggi-do (KR)

(73) Assignee: Samsung Electronics, Co., Ltd. (KR)

( * ) Notice: Subject to any disclaimer, the term of this patent is extended or adjusted under 35 U.S.C. 154(b) by 113 days.

(21) Appl. No.: 12/221,728

(22) Filed: Aug. 6, 2008

(65) Prior Publication Data
US 2009/0097297 A1  Apr. 16, 2009

(30) Foreign Application Priority Data
Aug. 6, 2007  (KR) ................... 10-2007-0078571

(51) Int. Cl.
 *G11C 5/02* (2006.01)
(52) U.S. Cl. .................... 365/51; 365/52; 365/102; 365/100; 365/149; 365/49.12
(58) Field of Classification Search .............. 365/51, 365/52, 102, 100, 149, 49.12
See application file for complete search history.

(56) References Cited

U.S. PATENT DOCUMENTS

| 7,113,418 | B2 | 9/2006 | Oberlin et al. | |
|---|---|---|---|---|
| 7,348,219 | B2 | 3/2008 | Kim et al. | |
| 2003/0222282 | A1* | 12/2003 | Fjelstad et al. | 257/200 |
| 2004/0186956 | A1* | 9/2004 | Perego et al. | 711/115 |
| 2004/0256638 | A1* | 12/2004 | Perego et al. | 257/200 |
| 2005/0097249 | A1 | 5/2005 | Oberlin et al. | |
| 2005/0166026 | A1* | 7/2005 | Ware et al. | 711/167 |
| 2006/0125071 | A1 | 6/2006 | Kim et al. | |
| 2006/0291263 | A1 | 12/2006 | Wallner et al. | |

FOREIGN PATENT DOCUMENTS

| JP | 2004-78657 | 3/2004 |
|---|---|---|
| JP | 2005-141741 | 6/2005 |
| KR | 10-2006-0065183 A | 6/2006 |

\* cited by examiner

*Primary Examiner*—Thong Q Le
(74) *Attorney, Agent, or Firm*—Mills & Onello, LLP

(57) ABSTRACT

A memory module having a start-type topology and a method of fabricating the same are provided. The memory module includes a substrate. Memory devices are mounted on the substrate in at least two rows and at least two columns. A star-type topology is disposed to be electrically connected to the memory devices. One or more pairs of adjacent ones of the memory devices have a point-symmetric structure.

25 Claims, 9 Drawing Sheets

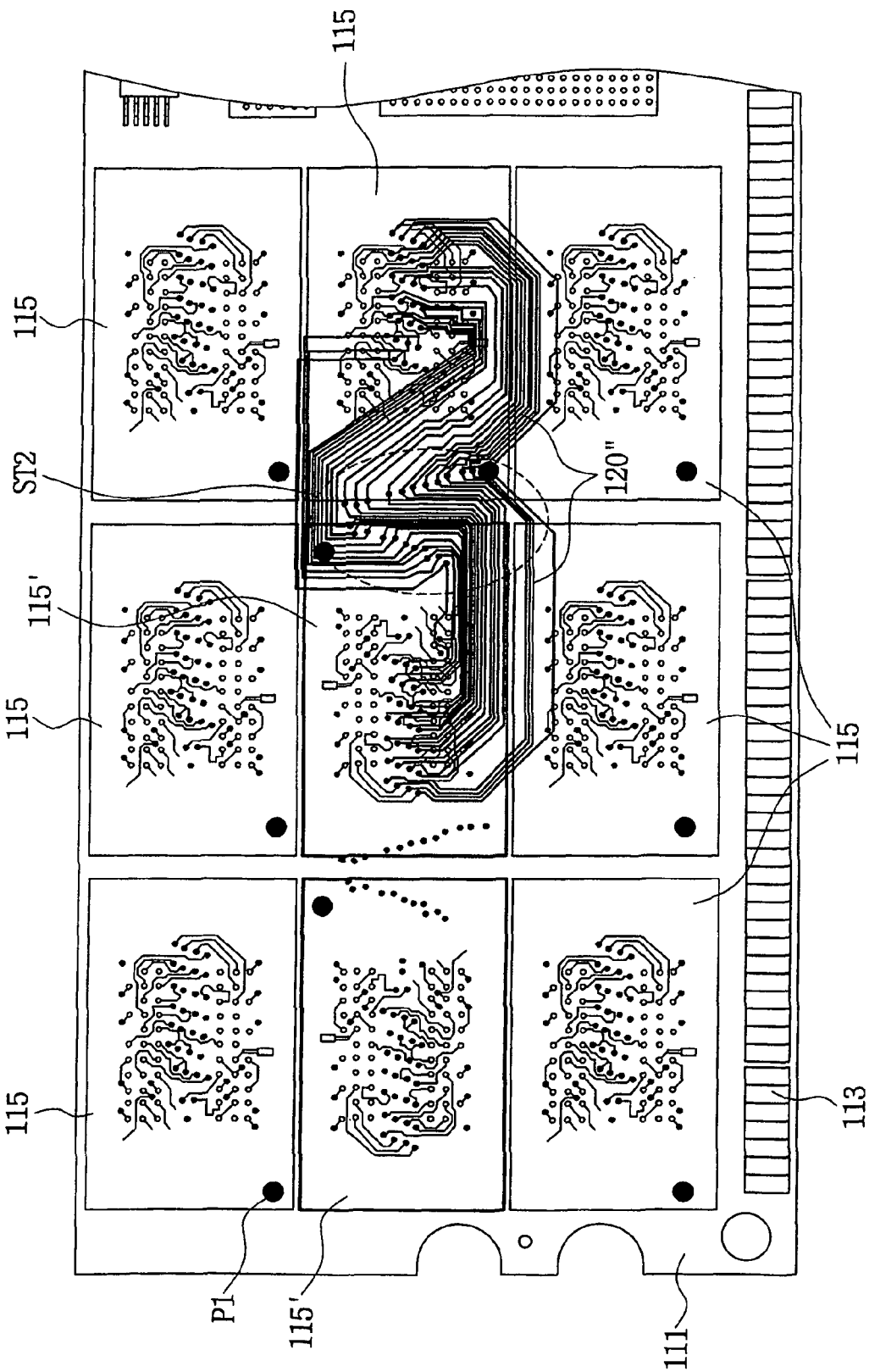

MEMORY MODULE HAVING STAR-TYPE TOPOLOGY AND METHOD OF FABRICATING THE SAME

CROSS-REFERENCE TO RELATED APPLICATION

This application claims the benefit of priority to Korean Patent Application No. 10-2007-0078571, filed Aug. 6, 2007, the contents of which are hereby incorporated herein by reference in their entirety.

BACKGROUND OF THE INVENTION

1. Field of the Invention

The present invention relates to a semiconductor device and a method of fabricating the same, and more particularly, to a memory module having a star-type topology and a method of fabricating the same.

2. Description of the Related Art

Various electronic systems, such as personal computers, system servers, and communication equipment, employ memory modules as data storage devices. The memory module has memory devices and discrete devices that are attached to a printed circuit board. The printed circuit board is provided with tabs for electrical connection to an external connector.

The memory devices include volatile memory devices, such as Dynamic Random Access Memory (DRAM) or Static RAM (SRAM). The discrete devices can be resistors, capacitors, inductors, registers, programmable devices, or non-volatile memory devices. The discrete devices act to distribute external signals applied to the tabs to the memory devices for storage. Data stored in the memory devices can be read out through the discrete devices.

FIG. 1 is a plan view of a conventional memory module.

Referring to FIG. 1, the conventional memory module has memory devices 15 and discrete devices 17 which are attached to a substrate 11. Tabs 13 are disposed at an edge of the substrate 11. The substrate 11 and the tabs 13 constitute a printed circuit board. Reference symbol P denoted in each of the memory devices 15 is a mark indicating a position of pin No. 1 of the memory device 15, as a reference.

Substrate 11 commonly takes the form of a multi-layered substrate formed by attaching four to eight-layered substrates to each other. The tabs 13 can be electrically connected to the memory devices 15 and the discrete devices 17 through interconnections formed within the substrate 11. In addition, the tabs 13 electrically connect the memory devices 15 and the discrete devices 17 to an external device.

The substrate 11 can have a long axis and a short axis. The memory device 15 can also have a long axis and a short axis. The short axis direction of the memory device 15 can be disposed in parallel with the long axis direction of the substrate 11. That is, the memory devices 15 can be arranged in a vertical direction. However, the memory devices 15 can have various sizes depending on high integration and large capacity. For example, a mass storage memory device 15' can have a larger external dimension than the memory devices 15. In this case, it is impossible to arrange the mass storage memory device 15' in two rows in a vertical direction relative to the substrate 11.

Most topologies of the conventional memory module are T topologies. However, as the size of a package increases with an increased density, it becomes more difficult to dispose within the limited substrate 11 the memory devices 15 which were typically arranged in a direction vertical to the substrate 11, as shown in FIG. 1. Accordingly, the memory devices 15 are disposed in both horizontal and vertical directions with respect to the substrate 11, or are disposed in the horizontal direction only. As a result, it becomes more difficult to implement a configuration of the topology and signal connection between the memory devices.

Consequently, a technique is needed that can effectively dispose memory devices on a substrate to keep lengths of internal interconnections between the memory devices and the topology uniform and short.

SUMMARY OF THE INVENTION

In accordance with various aspects of the invention there is provided a memory module having a star-type topology suitable for allowing memory devices to be more effectively disposed on a substrate so that the length of internal interconnections between the memory devices and the star-type topology can be kept uniform and short. A method of fabricating the foregoing memory module is also provided.

In accordance with one aspect of the invention, provided is a memory module having a star-type topology. The memory module has a substrate. Memory devices are mounted on the substrate in at least two rows and at least two columns. A star-type topology is electrically connected to the memory devices. One or more pairs of adjacent ones of the memory devices have a point-symmetric structure.

The substrate can have a long axis and a short axis.

The memory devices can have a long axis and a short axis.

The long axis direction of the memory devices can be parallel with the long axis direction of the substrate.

Otherwise, the short axis direction of the memory devices can be parallel with the long axis direction of the substrate.

A first set of the memory devices in one row can be disposed in a vertical direction relative to a second set of the memory device in a second row that is adjacent to the first row.

The substrate can include two surfaces and the memory devices can be mounted on one or both of the two surfaces of the substrate.

When four memory devices are mounted on one surface of the substrate or eight memory devices are mounted on both surfaces of the substrate, the memory devices can be electrically connected to the star-type topology through two signal layers within the substrate.

When five memory devices are mounted on one surface of the substrate, or nine or ten memory devices are mounted on both surfaces of the substrate, the memory devices can be electrically connected to the star-type topology through three signal layers within the substrate.

The substrate can include at least one surface and the memory module can further include a plurality of tabs disposed at edges of at least one surface of the substrate.

Discrete devices can be disposed on the substrate and spaced apart from the memory devices.

The discrete device can include at least one discrete device selected from a group consisting of a register, a capacitor, an inductor, a resistor, a programmable device and a non-volatile memory device.

The discrete devices can include a register and the memory devices can be electrically connected to the register through the star-type topology.

The memory devices can include volatile memory devices.

In accordance with another aspect of the invention, provided is a method of fabricating a memory module having a star-type topology. The method includes providing a substrate and mounting memory devices on the substrate in at least two rows and at least two columns. One or more pairs of adjacent ones of the memory devices have a point-symmetric structure. And the method includes forming a star-type topology to electrically connect the memory devices through a signal layer within the substrate.

The substrate can have a long axis and a short axis.

The memory devices can have a long axis and a short axis.

The method can include mounting the memory device so that the long axis direction of the memory devices can be parallel with the long axis direction of the substrate.

The method can include mounting the memory device so that the short axis direction of the memory devices can be parallel with the long axis direction of the substrate.

The method can include including mounting a first set of the memory devices in one row in a vertical direction relative to a second set of the memory device in a second row that is adjacent to the first row.

The substrate can include two surfaces and the method can include mounting the memory devices on one or both of the two surfaces of the substrate.

The method can include mounting four memory devices on one surface of the substrate or eight memory devices on both surfaces of the substrate, and electrically connecting the memory devices to the star-type topology through two signal layers within the substrate.

The method can include mounting five memory devices on one surface of the substrate, or nine or ten memory devices on both surfaces of the substrate, and electrically connecting the memory devices to the star-type topology through three signal layers within the substrate.

BRIEF DESCRIPTION OF THE DRAWINGS

The present invention will become more apparent in view of the attached figures and accompanying detailed description of example embodiments in accordance with the invention. The drawings are not necessarily to scale, emphasis instead being placed upon illustrating aspects of the invention. In the drawings:

FIG. 4A is a plan view illustrating a first signal layer in region A of the memory module of FIG. 2;

DETAILED DESCRIPTION OF THE PREFERRED EMBODIMENTS

Figure 1:
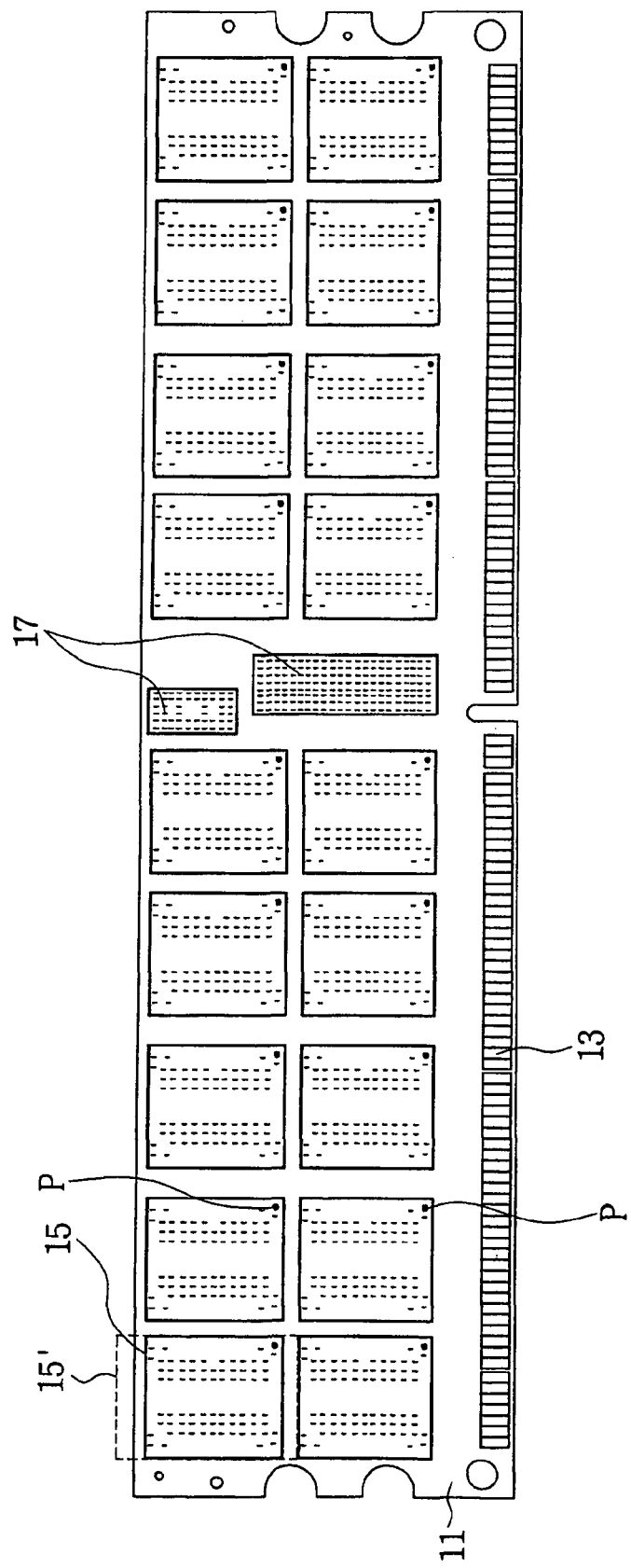
FIG. 1 is a plan view of a conventional memory module.

Hereinafter, aspects of the present invention will be described more fully with reference to the accompanying drawings, in which example embodiments in accordance therewith are shown. This invention can, however, be embodied in different forms and should not be construed as limited to the example embodiments set forth herein. In the drawings, the thickness of layers and regions are exaggerated for clarity. Like numbers refer to like elements throughout the specification.

It will be understood that, although the terms first, second, etc. are be used herein to describe various elements, these elements should not be limited by these terms. These terms are used to distinguish one element from another, but not to imply a required sequence of elements. For example, a first element can be termed a second element, and, similarly, a second element can be termed a first element, without departing from the scope of the present invention. As used herein, the term "and/or" includes any and all combinations of one or more of the associated listed items.

It will be understood that when an element is referred to as being "on" or "connected" or "coupled" to another element, it can be directly on or connected or coupled to the other element or intervening elements can be present. In contrast, when an element is referred to as being "directly on" or "directly connected" or "directly coupled" to another element, there are no intervening elements present. Other words used to describe the relationship between elements should be interpreted in a like fashion (e.g., "between" versus "directly between," "adjacent" versus "directly adjacent," etc.). For example, when a layer is described to be formed on another layer or on a substrate, that means that the layer can be formed directly on the other layer or the substrate, or a third layer can be interposed between the layer and the other layer or the substrate.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, steps, operations, elements, and/or components, but do not preclude the presence or addition of one or more other features, steps, operations, elements, components, and/or groups thereof.

Spatially relative terms, such as "beneath," "below," "lower," "above," "upper" and the like may be used to describe an element and/or feature's relationship to another element(s) and/or feature(s) as, for example, illustrated in the figures. It will be understood that the spatially relative terms are intended to encompass different orientations of the device in use and/or operation in addition to the orientation depicted in the figures. For example, if the device in the figures is turned over, elements described as "below" and/or "beneath" other elements or features would then be oriented "above" the other elements or features. The device may be otherwise oriented (e.g., rotated 90 degrees or at other orientations) and the spatially relative descriptors used herein interpreted accordingly.

Figure 2:
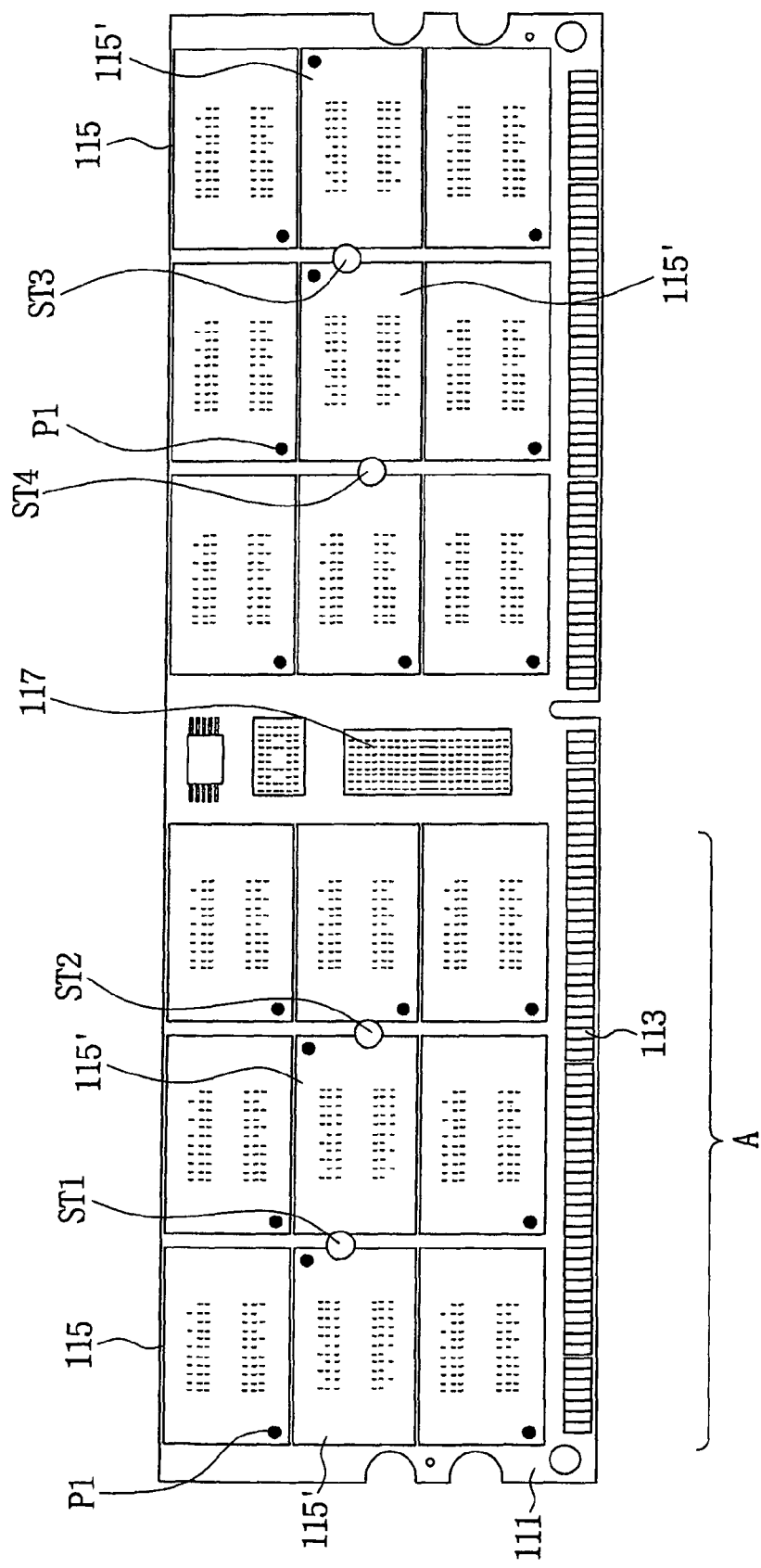
FIG. 2 is a plan view of an embodiment of a memory module according to aspects of the present invention.
Figure 3:
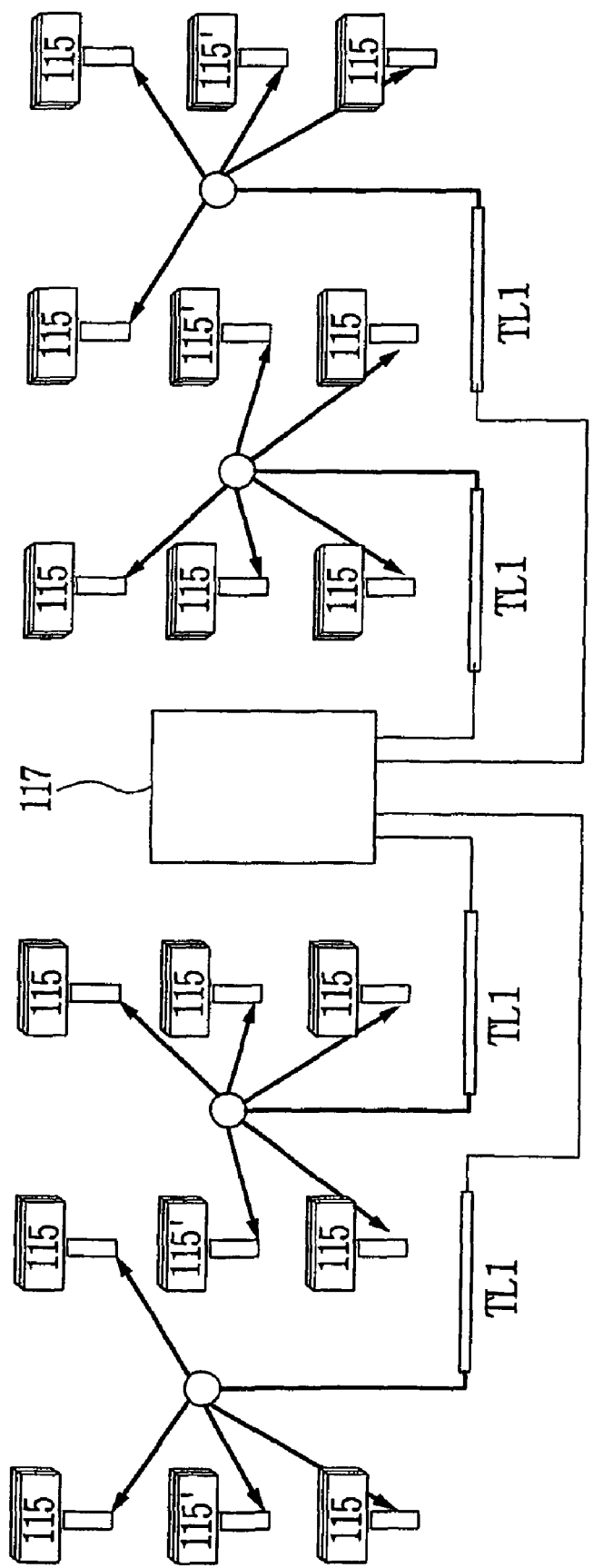
FIG. 3 is a schematic view illustrating embodiments of star-type topologies in the memory module of FIG. 2.
Figure 4B:
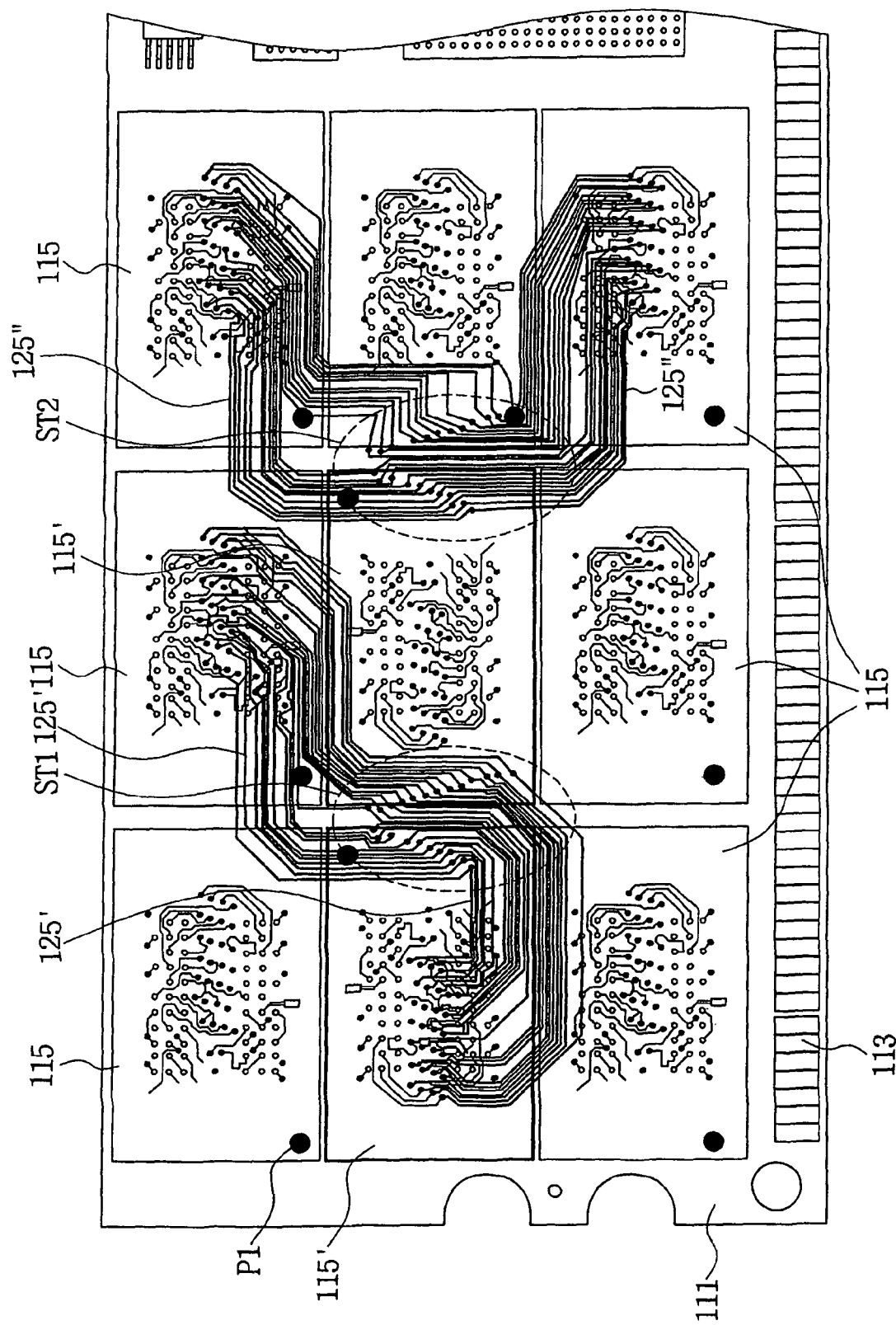
FIG. 4B is a plan view illustrating a second signal layer in region A of the memory module of FIG. 2.
Figure 4C:
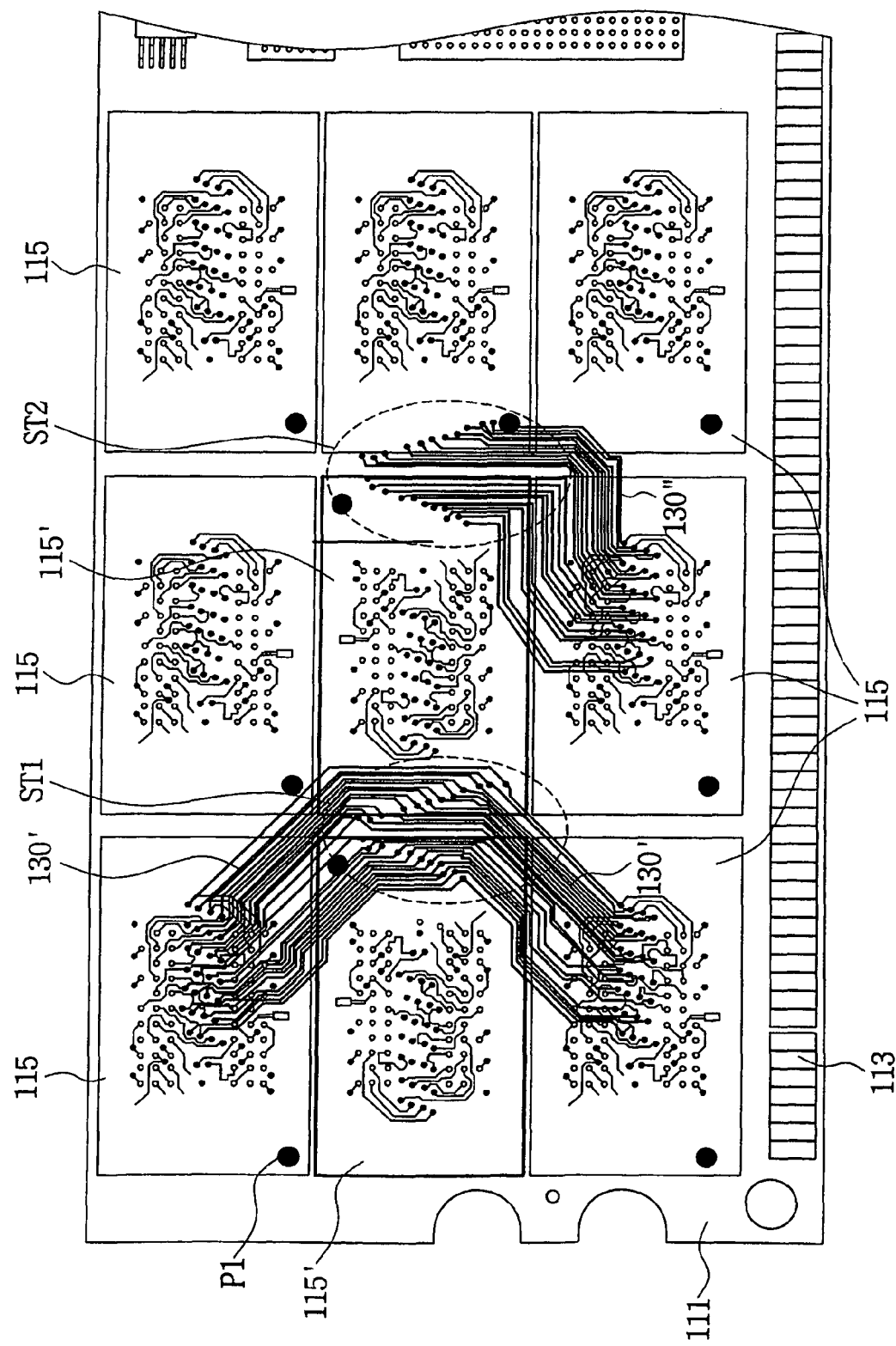
FIG. 4C is a plan view illustrating a third signal layer in region A of the memory module of FIG. 2.

FIG. 2 is a plan view of an embodiment of a memory module according to aspects of the present invention, and FIG. 3 is a schematic view illustrating embodiments of star-type topologies in the memory module of FIG. 2. In addition, FIGS. 4A, 4B, and 4C are plan views illustrating a first signal layer, a second signal layer, and a third signal layer in region A of the memory module of FIG. 2, respectively.

Referring to FIGS. 2, 3, 4A, 4B, and 4C, the memory module according to example embodiments has a substrate 111. Memory devices 115 and 115' are mounted on the substrate 111 in at least two rows and at least two columns. Reference symbol P1 denoted in each of the memory devices 115 and 115' is a mark indicating a position of pin No. 1 of the memory devices 115 and 115', as a reference. One or more pairs of adjacent memory devices in the memory devices 115 have a point-symmetric structure. In other words, the memory device 115' is disposed by rotating the memory device 115 by 180°. As a result, the rotated memory device 115' has a point-symmetric structure with respect to the memory device 115. The marks P1 denoted in the respective memory devices 115 and 115' make it easy to discriminate the rotated memory devices 115' from the memory devices 115.

The memory devices 115 and 115' can include volatile memory devices such as DRAM or SRAM, as examples. In addition, discrete devices 117 can be disposed on the substrate 111. Several tabs 113 can be disposed at an edge of one surface or both surfaces of the substrate 111. The memory devices 115 and 115' can be attached to the substrate 111 by several terminals disposed in a terminal region. The terminals can be conductive adhesive materials such as solder balls. The discrete devices 117 can be attached to the substrate by discrete device terminals. The discrete device terminals can be conductive adhesive materials, such as, for example, solder balls.

The memory module can be mounted into a socket to be electrically connected to an external device. In various electronic systems such as personal computers, system servers, and communication equipments, the memory modules can be widely employed as data storage devices of the systems. For example, a main board of the personal computer can be a type of external device. Such sockets can be disposed in the main board side by side. The external device can store/read out data in/from the memory module through the sockets.

Figure 5:
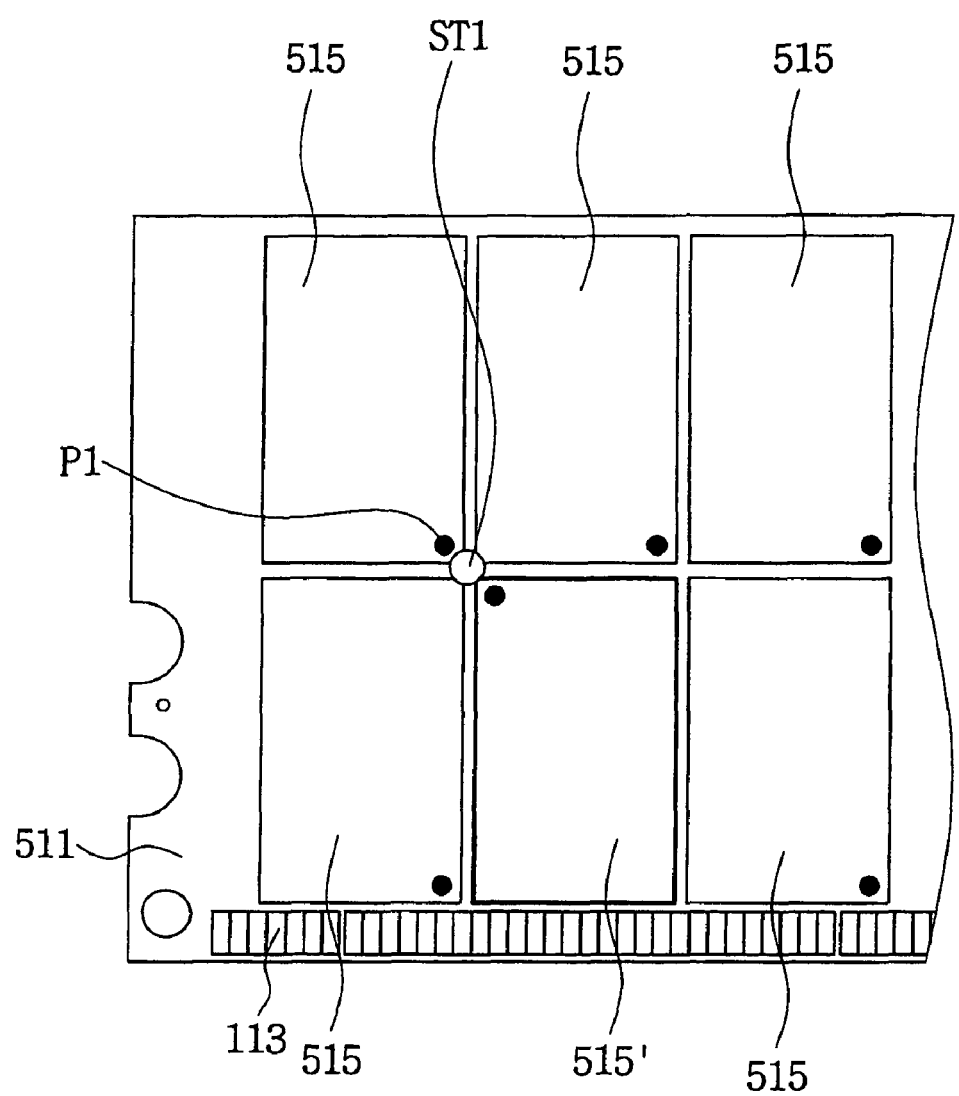
FIG. 5 is a plan view of another embodiment of a memory module according to aspects of the present invention.

The substrate 111 can be a thin plate having a long axis and a short axis. The memory devices 115 and 115' can also have a long axis and a short axis. As shown in FIG. 2, the long axis direction of the memory devices 115 and 115' can be disposed in parallel with the long axis direction of the substrate 111. In other example embodiments, as shown in FIG. 5, the short axis direction of the memory devices 515 and 515' can be disposed in parallel with the long axis direction of the substrate 511.

Figure 6:
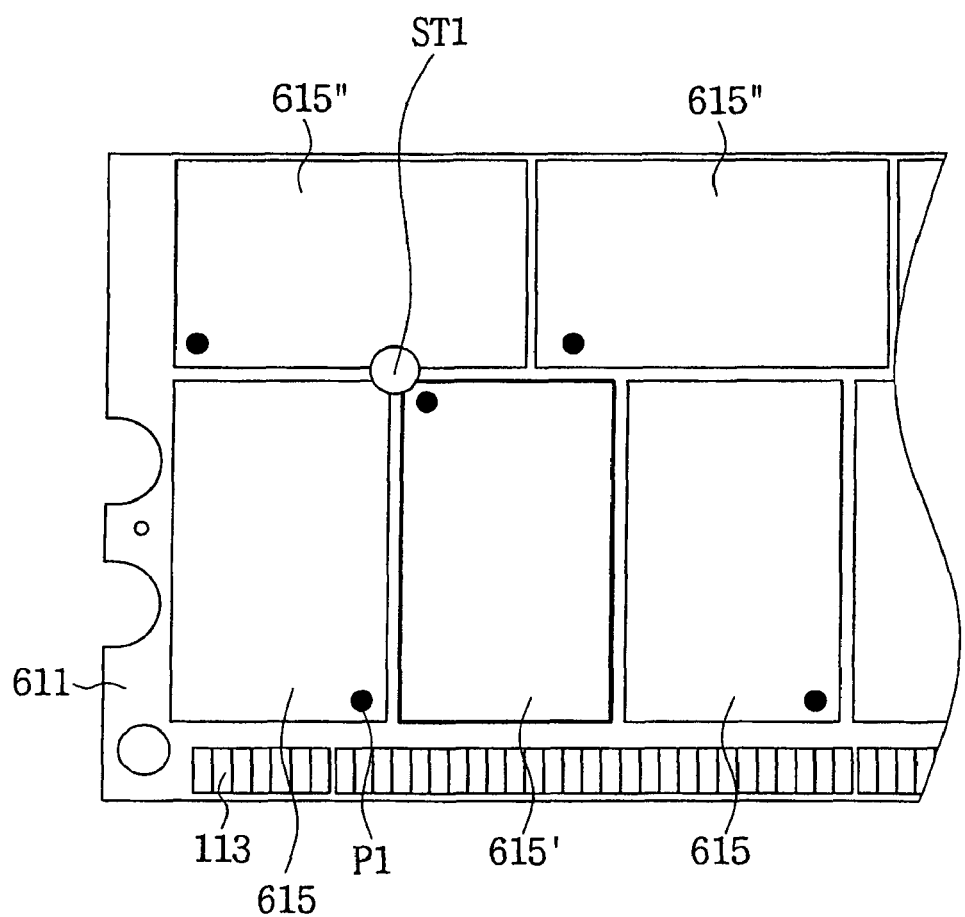
FIG. 6 is a plan view of still another embodiment of a memory module according to aspects of the present invention.

Alternatively, as shown in FIG. 6, the memory devices 615, 615', and 615" can be disposed in at least two rows in the short axis direction of the substrate 611, wherein the memory devices 615, 615', and 615" in one of the two adjacent rows can be disposed in a vertical direction with respect to the memory devices 615, 615', and 615" in the other of the two adjacent rows. That is, when the long axis direction of the substrate 611 is parallel with the long axis direction of the memory devices 615" in one row of the two adjacent rows, the long axis direction of the substrate 611 can be vertical with respect to the long axis direction of the memory devices 615 and 615' in the other row of the two adjacent rows.

Returning to FIG. 2, the discrete device 117 can include any one device selected from a group comprising of a resistor, a capacitor, an inductor, a register, a programmable device, and a non-volatile memory device. The discrete devices 117 can act to distribute input and output data to the memory devices 115 and 115'. The discrete device 117 can be a register 117, in this embodiment. The discrete devices 117 can be electrically connected to the memory devices 115 and 115' and the tabs 113. The tabs 113 can electrically connect the external device to the memory devices 115 and 115'.

Star-type topologies ST1, ST2, ST3, and ST4 can be disposed on the substrate 111 to be electrically connected to the memory devices 115 and 115'. The star-type topologies ST1, ST2, ST3, and ST4 can be electrically connected to the register 117 through transmission lines TL1, as shown in FIG. 3.

Accordingly, the memory devices 115 and 115' can be electrically connected to the register 117 through the star-type topologies ST1, ST2, ST3, and ST4.

The substrate 111 can have a structure formed by stacking four to eight-layered thin plates. First, second, and third signal layers can be disposed within the substrate 111. Internal interconnections 120", 125', 125", 130', and 130", which act to electrically connect the memory devices 115 and 115' to the register 117, can be disposed in the first, second, and third signal layers. The Internal interconnections 120", 125', 125", 130', and 130" can be a conductive material such as copper, for example.

The memory devices 115 and 115' can be mounted on one surface or both surfaces of the substrate 111. The discrete devices 117 can also be mounted on one surface or both surfaces of the substrate 111. In addition, the tabs 113 can be disposed on one surface or both surfaces of the substrate 111.

When four memory devices 115 and 115' are mounted on one surface of the substrate 111 or eight memory devices 115 and 115' are mounted on both surfaces of the substrate 111 (four memory devices on each surface), the memory devices 115 and 115' can be electrically connected to the star-type topologies ST1 and ST3 through two signal layers within the substrate 111.

Alternatively, when five memory devices 115 and 115' are mounted on one surface of the substrate 111 or nine or ten memory devices 115 and 115' are mounted on both surfaces of the substrate 111, the memory devices 115 and 115' can be electrically connected to the star-type topologies ST2 and ST4 through three signal layers within the substrate 111. With nine memory devices, four can be mounted on one surface and five can be mounted on the other surface. Similarly, with ten memory devices, five memory devices can be mounted on each surface. This will be described in detail with reference to FIGS. 4A, 4B, and 4C.

FIG. 4A illustrates the first internal interconnections 120" of the first signal layer, wherein two memory devices 115 and 115' are electrically connected to each other through the second topology ST2, as a reference. In this case, the rotated memory device 115' electrically connected to the second topology ST2 is disposed such that it has been rotated by 180° with respect to the memory device 115, so that the length of the internal interconnections 120" reaching the second topology ST2 can be substantially equal to the short length of the internal interconnections of the memory device 115, which is not rotated.

Figure 7:
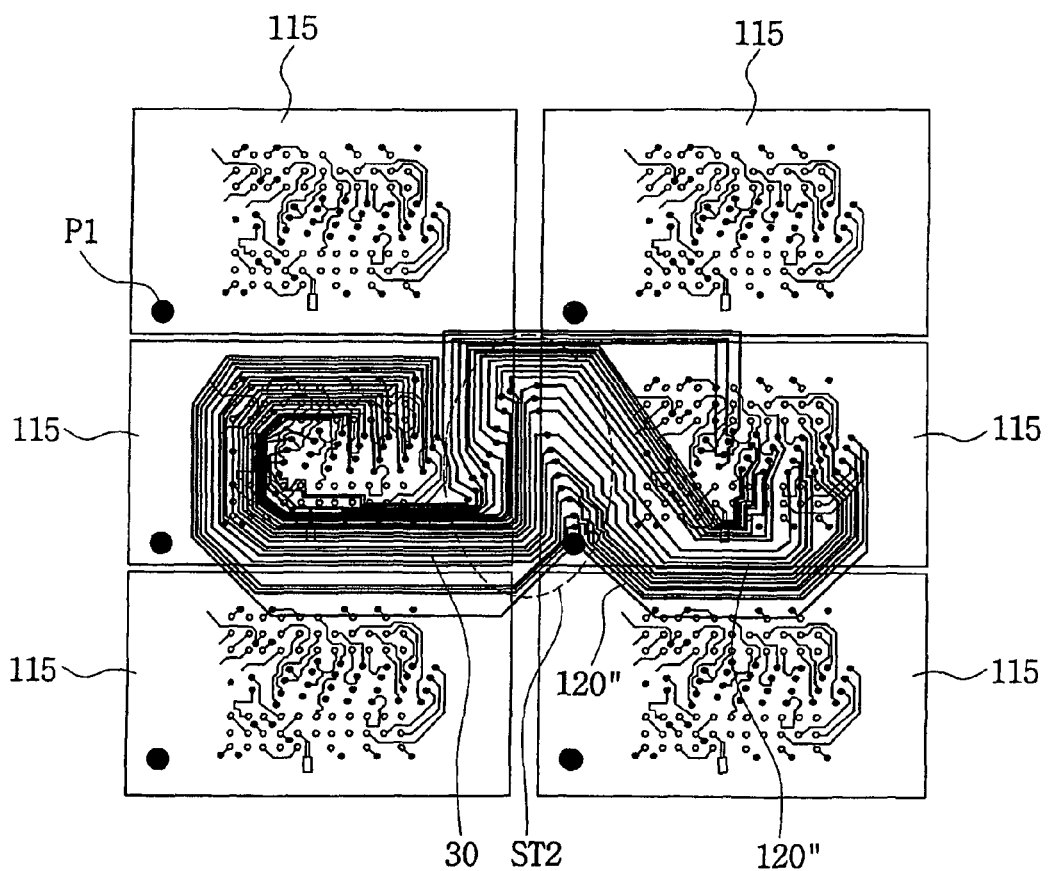
FIG. 7 is a plan view illustrating a first signal layer of a structure in which a memory device 115' rotated in FIG. 4A is rotated again by 180° to be disposed in the same way as the memory device 115.

When the rotated memory devices 115' are disposed such that they are not rotated as shown in FIG. 7, the internal interconnections 120" for the memory devices 115 to be electrically connected to the second topology ST2 must make a long detour in order to prevent the internal interconnections 30 from being overlapped or tangled with each other. Accordingly, the length of the internal interconnections reaching the second topology ST2 must be excessively increased to inevitably make the length of other short internal interconnections 120" also increased.

In contrast, in accordance with aspects of the present invention about one or two memory devices 115' can be rotated by 180° using one topology as a reference in comparison with other memory devices 115 so that the least number of signal layers can be used, and short internal interconnections can be used for electrically connecting the memory devices 115 and 115' to the topology ST2. In addition, the short channel interconnections make it possible to sufficiently secure an interconnection space which can be tuned, and signal integrity can be enhanced compared to the related art.

FIG. 4B illustrates the second internal interconnections 125' and 125" of the second signal layer, wherein two memory devices 115 and 115' are electrically connected to each other through each of the first and second topologies ST1 and ST2, as references. In this case, the rotated memory device 115' electrically connected to the first topology ST1 is disposed such that it has been rotated by 180° with respect to the memory device 115, so that the length of the internal interconnections 125' reaching the first topology ST1 can be substantially equal to the short length of the internal interconnections of the memory device 115 which is not rotated.

FIG. 4C illustrates the third internal interconnections 130' and 130" of the third signal layer, wherein the memory devices 115 are electrically connected to each other through the first and second topologies ST1 and ST2, as references. In this case, all of the memory devices 115 are arranged without rotation, while rotated memory devices 115' are disposed between the un-rotated memory devices 115. This orientation of rotated memory devices 115' results in a different configuration than that shown in FIG. 7. In FIG. 4C, the third internal interconnections 130' and 130" make less of a detour and are more direct than interconnections 30 in FIG. 7.

An embodiment of a method of fabricating the memory module according to aspects of the present invention will be described with reference to FIGS. 2, 3, 4A, 4B, and 4C.

Referring to FIGS. 2, 3, 4A, 4B, and 4C, the method includes providing and preparing a substrate 111. Memory devices 115 and 115' are mounted on the substrate 111 in at least two rows and at least two columns. Reference symbol P1 denoted in each of the respective memory devices 115 and 115' is a mark indicating a position of pin No. 1 of the memory devices 115 and 115', as a reference. In this case, one or more pairs of the adjacent memory devices 115 and 115' have a point-symmetric structure. In other words, the memory device 115' is a memory device 115 that has been rotated the memory device by 180°. As a result, the rotated memory device 115' has a point-symmetric structure with the memory device 115. The marks P1 denoted in the respective memory devices 115 and 115' make it easy to discriminate the rotated memory devices 115' from the memory devices 115.

The memory devices 115 and 115' can be formed to include volatile memory devices such as, for example, DRAM or SRAM. In addition, discrete devices 117 can be mounted on the substrate 111. A plurality of tabs 113 can be formed at an edge of one surface or both surfaces of the substrate 111. The memory devices 115 and 115' can be mounted on the substrate 111 by a plurality of terminals disposed in a terminal region. The terminals can be formed of a conductive adhesive material such as a solder ball, as an example. The discrete devices 117 can be mounted on the substrate 111 by discrete device terminals. The discrete device terminals can be formed of a conductive adhesive material, such as a solder ball.

The substrate 111 can be formed of a thin plate having a long axis and a short axis. The memory devices 115 and 115' can also be formed to have a long axis and a short axis. As shown in FIG. 2, the long axis direction of the memory devices 115 and 115' can be parallel with the long axis direction of the substrate 111. In other example embodiments, as shown in FIG. 5, the short axis direction of the memory devices 515 and 515' can be parallel with the long axis direction of the substrate 511. Alternatively, the memory devices 615, 615', and 615" can be mounted on the substrate 611 in at least two rows in the short axis direction as shown in FIG. 6, wherein the memory devices 615, 615', and 615" in the adjacent rows are disposed in a vertical direction relative to each other. In other words, when the long axis direction of the substrate 611 is parallel with the long axis direction of the memory devices 615" in one row of the two adjacent rows, the long axis direction of the substrate 611 can be vertical with respect to the long axis direction of the memory devices 615 and 615' in the other row of the two adjacent rows.

The discrete device 117 can be formed to include any one device selected from the group comprising a resistor, a capacitor, an inductor, a register, a programmable device, and a non-volatile memory device. The discrete device 117 can be the register 117, in this embodiment. The discrete devices 117 can act to distribute input and output data to the memory devices 115 and 115'. The discrete devices 117 can be electrically connected to the memory devices 115 and 115' and the tabs 113. The tabs 113 can act to electrically connect the external device to the memory devices 115 and 115'.

Star-type topologies ST1, ST2, ST3, and ST4 can be formed on the substrate 111 to be electrically connected to the memory devices 115 and 115'. As shown in FIG. 3, the star-type topologies ST1, ST2, ST3, and ST4 can be electrically connected to the register 117 through transmission lines TL1. Accordingly, the memory devices 115 and 115' can be electrically connected to the register 117 through the star-type topologies ST1, ST2, ST3, and ST4.

The substrate 111 can be formed by stacking four to eight-layered thin plates. First, second, and third signal layers can be formed within the substrate 111. Internal interconnections 120", 125', 125", 130', and 130", which act to electrically connect the memory devices 115 and 115' to the register 117, can be formed in the first, second, and third signal layers. The internal interconnections 120", 125', 125", 130', and 130" can be formed of a conductive material such as copper, as an example.

The memory devices 115 and 115' can be mounted on one surface or both surfaces of the substrate 111. The discrete devices 117 can also be mounted on one surface or both surfaces of the substrate 111. In addition, the tabs 113 can be mounted on one surface or both surfaces of the substrate 111.

When four memory devices 115 and 115' are mounted on one surface of the substrate 111 or eight memory devices 115 and 115' are mounted on both surfaces of the substrate 111, the memory devices 115 and 115' can be electrically connected to the star-type topologies ST1 and ST3 through two signal layers within the substrate 111.

Alternatively, when five memory devices 115 and 115' are mounted on one surface of the substrate 111 or nine or ten memory devices 115 and 115' are mounted on both surfaces of the substrate 111, the memory devices 115 and 115' can be electrically connected to the star-type topologies ST2 and ST4 through three signal layers within the substrate 111. This will be described in detail with reference to FIGS. 4A, 4B, and 4C.

FIG. 4A illustrates a method of making the first internal interconnections 120" of the first signal layer, wherein two memory devices 115 and 115' are formed to be electrically connected to each other through the second topology ST2 as a reference. In this case, the rotated memory device 115' electrically connected to the second topology ST2 is formed such that it has been rotated by 180° with respect to the memory device 115, so that the length of the internal interconnections 120" reaching the second topology ST2 can be substantially equal to the short length of the internal interconnections of the memory device 115 which is not rotated.

Therefore, in accordance with aspects of the present invention, about one or two memory devices 115' can be formed by rotating the memory devices 115 by 180° using one topology as a reference in comparison with other memory devices 115 so that the least number of signal layers can be used, and short internal interconnections can be used for electrically connecting the memory devices 115 and 115' to the topology ST2. In addition, forming the short channel interconnections in such a manner makes it possible to sufficiently secure an interconnection space that can be tuned, and signal integrity can be enhanced, when compared to conventional approaches.

FIG. 4B illustrates a method of making the second internal interconnections 125' and 125" in the second signal layer, wherein two memory devices 115 and 115' are formed to be electrically connected to each other through each of the first and second topologies ST1 and ST2, as references. In this case, the rotated memory device 115' electrically connected to the first topology ST1 is formed such that it has been rotated by 180° with respect to the memory device 115, so that the length of the internal interconnections 125' reaching the first topology ST1 can be substantially equal to the short length of the internal interconnections of the memory device 115, which is not rotated.

FIG. 4C illustrates a method of making the third internal interconnections 130' and 130" in the third signal layer, wherein the memory devices 115 are formed to be electrically connected to each other through the first and second topologies ST1 and ST2 as a reference. In this case, all of the memory devices 115 are arranged without rotation, with rotated memory devices 115' disposed therebetween. When the rotated memory devices 115' are used, rather than all un-rotated memory devices 115 as shown in FIG. 7, the third internal interconnections 130' and 130" make a detour to comply with the increased length of the internal interconnections, but this detour is not as long or indirect as that of the interconnections 30 in FIG. 7.

According to aspects of the present invention as described above, the present invention allows one or two memory devices to be rotated by 180° using one topology as a reference in comparison with other memory devices so that the least number of signal layers can be used, and short internal interconnections can be used for electrically connecting the memory devices to the topologies. In addition, the short channel interconnections make it possible to sufficiently secure an interconnection space which can be tuned, and signal integrity can be enhanced when compared to conventional approaches.

While the foregoing has described what are considered to be the best mode and/or other preferred embodiments, it is understood that various modifications can be made therein and that the invention or inventions may be implemented in various forms and embodiments, and that they may be applied in numerous applications, only some of which have been described herein. It is intended by the following claims to claim that which is literally described and all equivalents thereto, including all modifications and variations that fall within the scope of each claim.

What is claimed is:

1. A memory module, comprising:
a substrate;
memory devices mounted on the substrate in at least two rows and at least two columns; and
a star-type topology electrically connected to the memory devices,
wherein one or more pairs of adjacent ones of the memory devices have a point-symmetric structure.

2. The memory module according to claim 1, wherein the substrate has a long axis and a short axis.

3. The memory module according to claim 2, wherein the memory devices have a long axis and a short axis.

4. The memory module according to claim 3, wherein the long axis direction of the memory devices is disposed in parallel with the long axis direction of the substrate.

5. The memory module according to claim 3, wherein the short axis direction of the memory devices is disposed in parallel with the long axis direction of the substrate.

6. The memory module according to claim 3, wherein a first set of the memory devices in one row is disposed in a vertical direction relative to a second set of the memory device in a second row that is adjacent to the first row.

7. The memory module according to claim 1, wherein the substrate includes two surfaces and the memory devices are mounted on one or both of the two surfaces of the substrate.

8. The memory module according to claim 7, wherein when four memory devices are mounted on one surface of the substrate or eight memory devices are mounted on both surfaces of the substrate, the memory devices are electrically connected to the star-type topology through two signal layers within the substrate.

9. The memory module according to claim 7, wherein when five memory devices are mounted on one surface of the substrate, or nine or ten memory devices are mounted on both surfaces of the substrate, the memory devices are electrically connected to the star-type topology through three signal layers within the substrate.

10. The memory module according to claim 1, wherein the substrate includes at least one surface, the memory module further comprising:
a plurality of tabs disposed at edges of the at least one surface of the substrate.

11. The memory module according to claim 1, further comprising:
discrete devices disposed on the substrate and spaced apart from the memory devices.

12. The memory module according to claim 11, wherein the discrete devices include at least one discrete device selected from a group consisting of a register, a capacitor, an inductor, a resistor, a programmable device and a non-volatile memory device.

13. The memory module according to claim 12, wherein the discrete devices include a register and the memory devices are electrically connected to the register through the star-type topology.

14. The memory module according to claim 1, wherein the memory devices include volatile memory devices.

15. The memory module according to claim 1, wherein a length of an internal interconnection between a rotated memory device and the star-type-topology is substantially equal to a length of an internal interconnection between the star-type topology and a memory device that is not rotated.

16. A method of fabricating a memory module, comprising:
providing a substrate;
mounting memory devices on the substrate in at least two rows and at least two columns, including mounting one or more pairs of adjacent ones of the memory devices to have a point-symmetric structure; and
forming a star-type topology electrically connecting the memory devices through a signal layer within the substrate.

17. The method according to claim 16, wherein the substrate has a long axis and a short axis.

18. The method according to claim 17, wherein the memory device has a long axis and a short axis.

19. The method according to claim 18, including mounting the memory devices so that the long axis direction of the memory devices is disposed in parallel with the long axis direction of the substrate.

20. The method according to claim 18, including mounting the memory devices so that the short axis direction of the memory devices is disposed in parallel with the long axis direction of the substrate.

21. The method according to claim 18, including mounting a first set of the memory devices in one row in a vertical direction relative to a second set of the memory device in a second row that is adjacent to the first row.

22. The method according to claim 16, wherein the substrate includes two surfaces, the method including mounting memory devices on one or both of the two surfaces of the substrate.

23. The method according to claim 22, including mounting four memory devices on one surface of the substrate or eight memory devices on both surfaces of the substrate, and electrically connecting the memory devices to the star-type topology through two signal layers within the substrate.

24. The method according to claim 22, including mounting five memory devices on one surface of the substrate, or nine or ten memory devices on both surfaces of the substrate, and electrically connecting the memory devices to the star-type topology through three signal layers within the substrate.

25. The method according to claim 16, wherein a length of an internal interconnection between a rotated memory device and the star-type-topology is substantially equal to a length of an internal interconnection between the star-type topology and a memory device that is not rotated.

* * * * *